United States Patent
Kim et al.

(10) Patent No.: US 11,482,505 B2
(45) Date of Patent: Oct. 25, 2022

(54) CHIP BONDING APPARATUS

(71) Applicant: Samsung Electronics Co., Ltd., Suwon-si (KR)

(72) Inventors: Jae-Cheol Kim, Suwon-si (KR); Gil Man Kang, Suwon-si (KR); Yong Dae Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 409 days.

(21) Appl. No.: 16/582,405

(22) Filed: Sep. 25, 2019

(65) Prior Publication Data

US 2020/0312811 A1    Oct. 1, 2020

(30) Foreign Application Priority Data

Mar. 29, 2019  (KR) .................. 10-2019-0036568

(51) Int. Cl.
*H01L 23/00* (2006.01)

(52) U.S. Cl.
CPC ...... *H01L 24/75* (2013.01); *H01L 2224/7598* (2013.01); *H01L 2224/75252* (2013.01); *H01L 2224/75302* (2013.01); *H01L 2224/75702* (2013.01); *H01L 2224/75705* (2013.01); *H01L 2224/75725* (2013.01); *H01L 2224/75745* (2013.01); *H01L 2224/75824* (2013.01)

(58) Field of Classification Search
CPC . H01L 2224/75252; H01L 2224/75302; H01L 2224/75313; H01L 2224/75314; H01L 2224/75317; H01L 2224/7565; H01L 2224/75702

See application file for complete search history.

(56) References Cited

U.S. PATENT DOCUMENTS

| | | | |
|---|---|---|---|
| 6,414,271 B2 * | 7/2002 | Yokoyama | H01L 24/75 219/443.1 |
| 7,797,822 B2 | 9/2010 | Sakai et al. | |
| 8,381,965 B2 | 2/2013 | Jang et al. | |
| 10,692,833 B2 * | 6/2020 | Kim | H01L 24/75 |

(Continued)

FOREIGN PATENT DOCUMENTS

| | | |
|---|---|---|
| JP | 6-82878 U | 11/1994 |
| JP | 3898630 B9 | 1/2007 |

(Continued)

*Primary Examiner* — Minh N Trinh
(74) *Attorney, Agent, or Firm* — Muir Patent Law, PLLC

(57) ABSTRACT

Embodiments in accordance with the present inventive concept disclose a chip bonding apparatus that includes a stage configured to support a substrate and a heater that is disposed above the stage. The heater includes a heat generating portion and a body portion. The chip bonding apparatus further includes a bonding tool assembly fixing unit having a first portion connected to the body portion of the heater, and a second portion configured to receive the heat generating portion. The chip bonding apparatus further includes a first bonding tool connected to the heat generating portion; and a first bonding tool fixing unit having a third portion that is connected to the first portion, and a fourth portion configured to receive the first bonding tool. The bonding tool fixing unit may be attached by an electrostatic force or by coupling between a notch gripper and a corresponding notch.

12 Claims, 16 Drawing Sheets

(56) References Cited

U.S. PATENT DOCUMENTS

| | | | |
|---|---|---|---|
| 2009/0289098 A1* | 11/2009 | Terada | H01L 24/75 |
| | | | 228/102 |
| 2013/0181040 A1* | 7/2013 | Watanabe | H01L 25/50 |
| | | | 228/211 |
| 2020/0312811 A1* | 10/2020 | Kim | H01L 24/75 |

FOREIGN PATENT DOCUMENTS

| | | |
|---|---|---|
| JP | 4508124 B9 | 5/2010 |
| JP | 2015-170646 A | 9/2015 |
| WO | 2014065199 A1 | 5/2014 |
| WO | 16031806 A1 | 3/2016 |

* cited by examiner

CHIP BONDING APPARATUS

This application claims priority from Korean Patent Application No. 10-2019-0036568 filed on Mar. 29, 2019 in the Korean Intellectual Property Office, the disclosure of which is incorporated by reference herein in its entirety.

BACKGROUND

1. Technical Field

The present inventive concept relates to a chip bonding apparatus, a system for replacing a bonding tool assembly, and a method for fabricating a semiconductor device using the chip bonding apparatus.

2. Description of the Related Art

Conventionally, a semiconductor device is typically fabricated through a FAB (Fabrication) process of forming an electrical circuit on a silicon wafer, an EDS (Electrical Die Sorting) process of inspecting the electrical characteristics of semiconductor devices formed in the Fab process, and a package process of sealing and individualizing the semiconductor device with a synthetic resin.

The package process of the semiconductor chip includes a sawing process of cutting a silicon wafer with a circuit of a fine pattern formed thereon in a chip unit of a predetermined size, a chip bonding process of bonding the chip to a substrate, a wire bonding process of electrically connecting the chip and the substrate using conductive wires, and a mold process of protecting the conductive wires and the chip from the external environment.

Conventionally, a chip bonding apparatus for performing a chip bonding process generally includes a heater, and a bonding tool that is directly connected to the heater. The bonding tool heats and presses the chip on the substrate to bond the substrate and the chip. However, since the bonding tool is generally connected directly to the heater, stress due to the connection between the bonding tool and the heater is transferred to the bonding tool. In addition, when the connection between the bonding tool and the heater is relatively weak, accidents such as falling-off of the bonding tool can occur when performing the chip bonding process.

SUMMARY

Aspects of the present inventive concept provide a chip bonding apparatus in which deformation or breakage of a bonding tool is minimized.

Aspects of the present inventive concept also provide a chip bonding apparatus that prevents the bonding tool from falling off.

Aspects of the present inventive concept also provide an automated system for replacing the bonding tool assembly.

Aspects of the present inventive concept also provide a method for fabricating a semiconductor device using the chip bonding apparatus.

However, aspects of the present inventive concept are not restricted to the ones set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a chip bonding apparatus that includes a stage configured to support a substrate and a heater disposed above the stage. The heater may include a heat generating portion and a body portion. The chip bonding apparatus may further include a bonding tool assembly fixing unit having a first portion connected to the body portion of the heater, and a second portion configured to receive the heat generating portion of the heater. The chip bonding apparatus may further include a first bonding tool connected to the heat generating portion of the heater and a first bonding tool fixing unit. The first bonding tool fixing unit may have a third portion connected to the first portion of the bonding tool assembly fixing unit, and a fourth portion configured to receive the first bonding tool. In some embodiments, the third portion of the first bonding tool fixing unit is configured to attach to the first portion of the bonding tool assembly fixing unit by an electrostatic force. that includes a stage configured to support a substrate and a heater disposed above the stage. The heater may include a heat generating portion and a body portion. The chip bonding apparatus may further include a bonding tool assembly fixing unit having a first portion connected to the body portion of the heater, and a second portion configured to receive the heat generating portion of the heater. The chip bonding apparatus may further include a first bonding tool connected to the heat generating portion of the heater and a first bonding tool fixing unit. The first bonding tool fixing unit may have a third portion connected to the first portion of the bonding tool assembly fixing unit, and a fourth portion configured to receive the first bonding tool. In some embodiments, the third portion of the first bonding tool fixing unit is configured to attach to the first portion of the bonding tool assembly fixing unit by an electrostatic force.

According to an aspect of the present inventive concept, there is provided A chip bonding apparatus that includes a stage that is configured to support a substrate and a heater disposed above the stage. The heater may include a heat generating portion and a body portion. The chip bonding apparatus may further include a bonding tool assembly fixing unit that includes a first portion connected to the body portion of the heater, and a second portion configured to receive the heat generating portion. The first portion may include a first notch gripper. The chip bonding apparatus may further include a first bonding tool that is connected to the heat generating portion of the heater and a first bonding tool fixing unit. The first bonding tool fixing unit may include a third portion that is connected to the first portion of the bonding tool assembly fixing unit, and a fourth portion that is configured to receive the first bonding tool. In some embodiments, the third portion may include a first notch that corresponds to the first notch gripper and the third portion is configured to attach to the first portion by coupling between the first notch gripper and the first notch.

According to an aspect of the present inventive concept, there is provided a chip bonding apparatus that includes a stage configured to support a substrate and a heater disposed above the stage. The heater may include a heat generating portion and a body portion. The chip bonding apparatus may further include a first bonding tool assembly having a first bonding tool that is connected to the heat generating portion of the heater, and a first bonding tool fixing unit that is in contact with at least a part of the first bonding tool. The chip bonding apparatus may further include a bonding tool assembly fixing unit that is connected to the body portion of the heater and the first bonding tool assembly. In some embodiments, the first bonding tool assembly is attachable to and detachable from the bonding tool assembly fixing unit, and at least a part of the first bonding tool is disposed between the first bonding tool fixing unit and the bonding tool assembly fixing unit.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
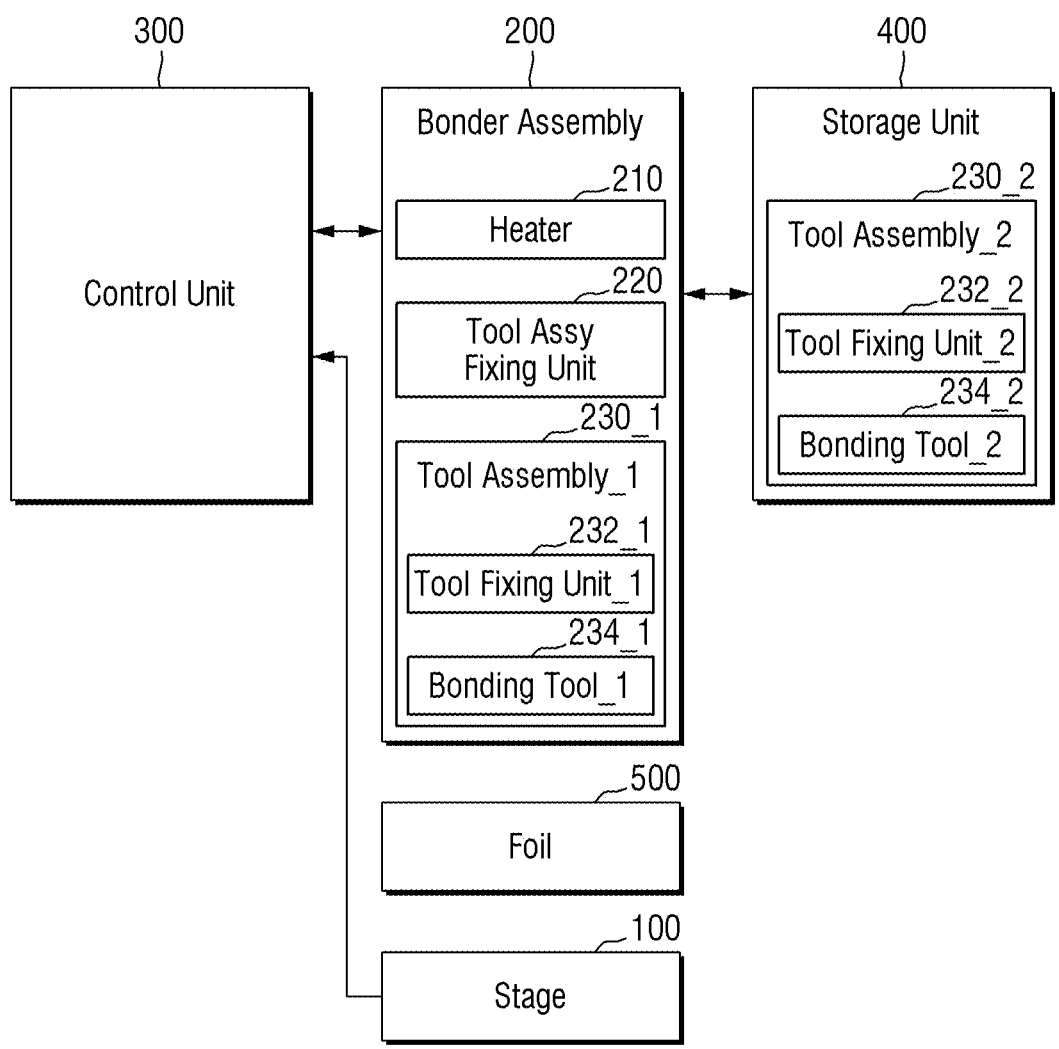
FIG. 1 is an exemplary block diagram illustrating a chip bonding apparatus and system according to some embodiments.

FIG. 1 is an exemplary block diagram illustrating a chip bonding apparatus and system according to some embodiments.

Referring to FIG. 1, the chip bonding apparatus according to some embodiments may include a stage 100, a chip bonder assembly 200, a control unit 300, a bonding tool assembly storage unit 400 and a foil 500. A chip bonding process using the chip bonding apparatus according to some embodiments will be described with reference to FIGS. 2 and 3.

Figure 2:
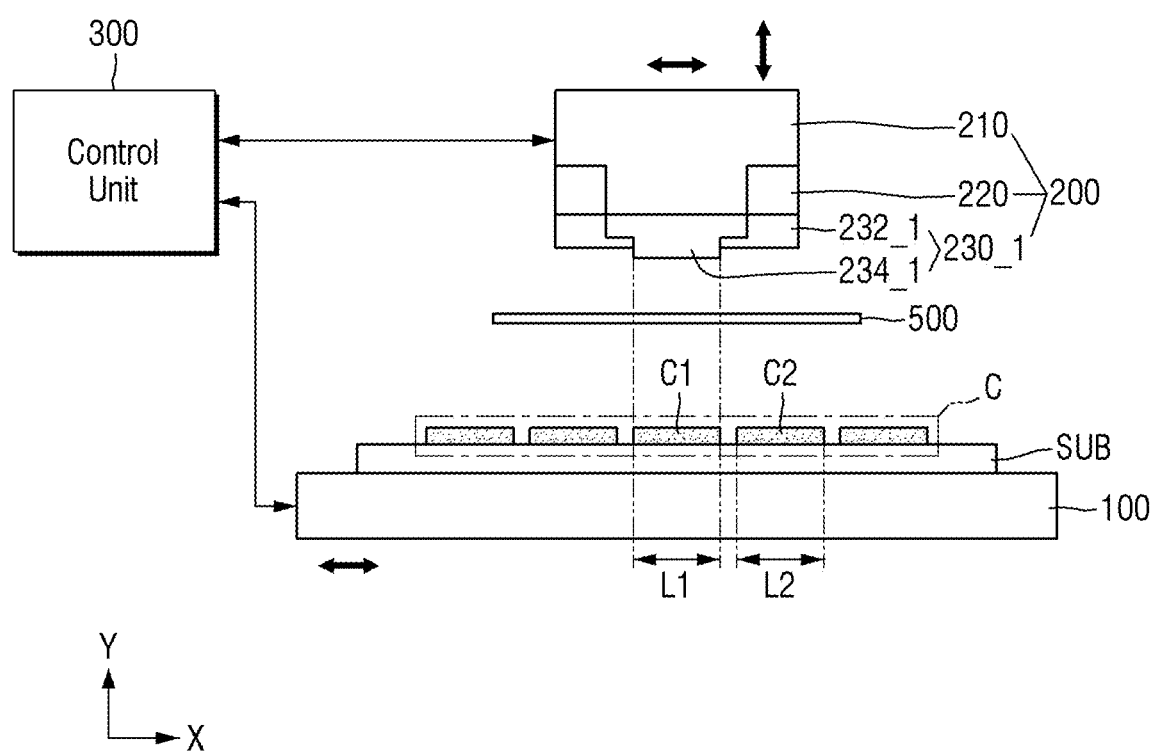
FIGS. 2 and 3 are exemplary diagrams illustrating the chip bonding process according to some embodiments, respectively.
Figure 3:
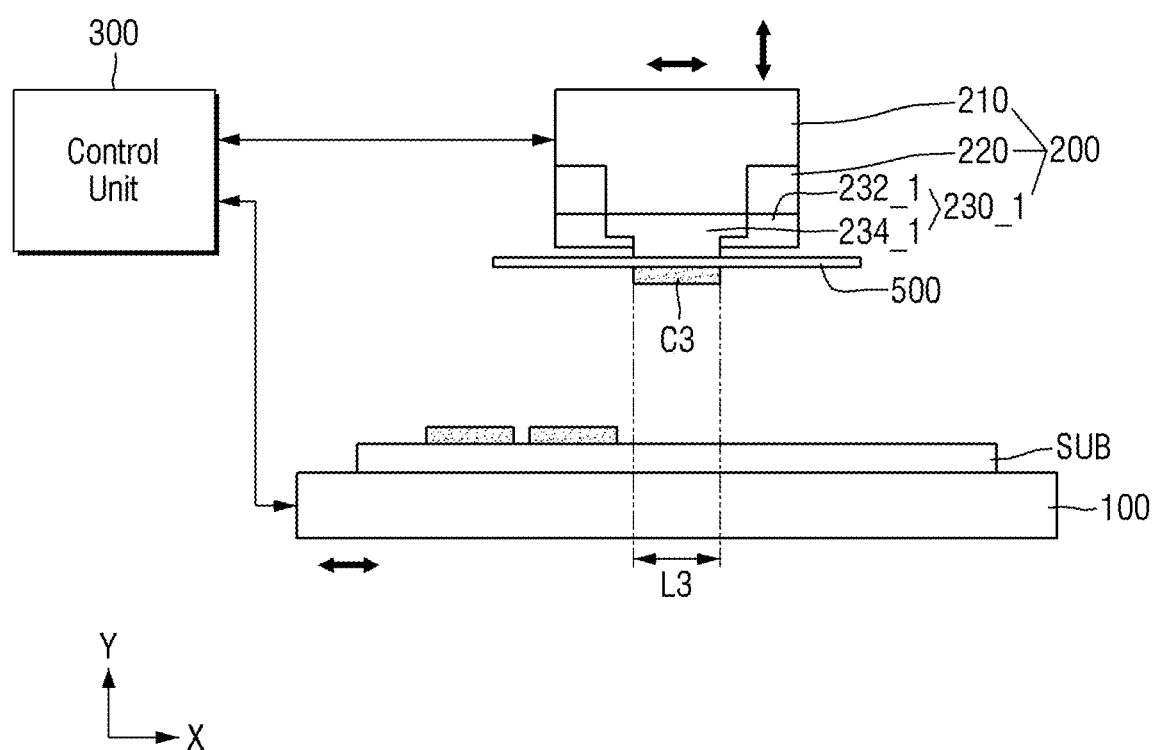

FIGS. 2 and 3 are exemplary diagrams illustrating a chip bonding process according to some embodiments, respectively.

Referring to FIGS. 1 and 2, the chip bonder assembly 200 may include a heater 210, a bonding tool assembly fixing unit 220, and a first bonding tool assembly 230_1. The first bonding tool assembly 230_1 may include a first bonding tool fixing unit 232_1, and a first bonding tool 234_1.

The heater 210 may provide heat to the first bonding tool 234_1. The first bonding tool 234_1 may perform the chip bonding process, using heat provided from the heater 210.

The bonding tool assembly fixing unit 220 may attach and detach the first bonding tool assembly 230_1. For example, the bonding tool assembly fixing unit 220 may attach and detach the first bonding tool assembly 230_1, by an electrostatic force (electrostatic bond). In another example, the bonding tool assembly fixing unit 220 may attach and detach the first bonding tool assembly 230_1, using a notch gripper. The specific description thereof will be described later.

The chip bonder assembly 200 may heat and press each of the plurality of chips C disposed on the substrate SUB. For example, the chip bonder assembly 200 may heat the adhesive materials disposed on the lower surfaces of each of the plurality of chips C disposed on the substrate SUB to melt the adhesive materials. For example, the adhesive materials may be heated until they are fluid like, liquid, or semi-liquid. Subsequently, the chip bonder assembly 200 may press each of the plurality of chips C disposed on the substrate SUB to bond each of the plurality of chips C to the substrate SUB. At this time, the foil 500 may be interposed between the chip bonder assembly 200 and the plurality of chips C.

The foil 500 may prevent the adhesive materials of the lower surfaces of the plurality of chips C from overflowing to the upper surfaces of each of the plurality of chips C when they are pressed into the adhesive. Also, the foil 500 may prevent the adhesive materials of the lower surfaces of the plurality of chips C from being glued to the chip bonder assembly 200 (for example, the first bonding tool assembly 230_1) to prevent contamination of the chip bonder assembly 200. For example, foil 500 may include a teflon material such as teflon tape, although the embodiments herein are not limited thereto.

The substrate SUB on which the chip bonding process is performed may be disposed on the stage 100. The term "stage" is meant to be used in its broadest sense to include a platform or structural surface for supporting a substrate SUB. Also, the foil 500 may be disposed on the substrate SUB, and the chip bonder assembly 200 may be disposed on the foil 500. For example, the chip bonder assembly 200 and the foil 500 may be disposed on the stage 100.

The substrate SUB may be, for example, a package substrate such as a printed circuit board, but the embodiments herein are not limited thereto. A plurality of chips C may be disposed on the substrate SUB. The plurality of chips C disposed on the substrate SUB may include a chip on which the chip bonding process is performed and/or a chip on which the chip bonding process has already been performed.

According to some embodiments, a plurality of chips C may be disposed on the substrate SUB at predetermined intervals. For example, the plurality of chips C may include a first chip C1 disposed on a first position L1 of the substrate SUB, and a second chip C2 disposed on a second position L2 of the substrate SUB.

In accordance with a control signal from the control unit 300, the chip bonder assembly 200 may be moved to the first position L1 along a first direction X. The term "control unit" is meant to be used in its broadest sense to include one or more controllers and/or microprocessors, and/or other computer hardware and/or software that may be associated with chip bonder assembly 200 and first bonding tool 100 and that may cooperate in controlling various functions and operations of machine 10. Positioning of the chip bonder assembly 200 at the first position L1 means that the first bonding tool 234_1 is aligned with the first position L1. The first position L1 may correspond to the position of the first chip C1 on the substrate SUB. For example, the control unit 300 directly moves the chip bonder assembly 200 along the first direction X and may control the chip bonder assembly 200 to be positioned at the first position L1. In another example, the control unit 300 moves the stage 100 along the first direction X, and may control the chip bonder assembly 200 to be positioned at the first position L1. However, the embodiments are not limited thereto, and those skilled in the art of the present inventive concept will understand that the chip bonder assembly 200 can be positioned at the first position L1 in various ways.

According to some embodiments, the chip bonder assembly 200 may move along a second direction Y at the first position L1 in accordance with a control signal from the control unit 300. For example, the chip bonder assembly 200 may move along the second direction Y at the first position L1 to heat and press the first chip C1. At this time, the first bonding tool 234_1 may come into contact with the first chip C1 through the foil 500. As used herein, the meaning of both components "coming into contact with each other" shall be construed in its broadest sense to mean that another component may be interposed between both components, e.g., as explained above. Additionally, the meaning of both components "coming into direct contact with each other" means that no other components are interposed between both components, as may be described in the specification and/or depicted in the drawings. After completion of heating and pressure (i.e., after completion of bonding of the first chip C1), the chip bonder assembly 200 may be moved to the second position L2 along the first direction X from the first position L1, in accordance with a control signal from the control unit 300. Subsequently, the bonding process of the second chip C2 may be performed in the same or similar manner as described above.

Referring to FIGS. 1 and 3, the chip bonder assembly 200 may include a heater 210, a bonding tool assembly fixing unit 220, and a first bonding tool assembly 230_1. The first bonding tool assembly 230_1 may include a first bonding tool fixing unit 232_1, and a first bonding tool 234_1. Since the chip bonder assembly 200 of FIG. 3 is similar to the chip bonder assembly 200 of FIG. 2, repeated description will not be provided and differences will be mainly described.

The chip bonder assembly 200 may pick the third chip C3 up. For example, the chip bonder assembly 200 may be moved to a chip storage (not illustrated) to pick the third chip C3 up. According to some embodiments, a pumping line may be disposed inside the heater 210 and the first bonding tool 234_1, and the third chip C3 may be picked up by an external pump connected to the pumping line. However, the embodiments are not limited thereto, and those skilled in the art of the present inventive concept will understand that the third chip C3 may be picked up using the chip bonder assembly 200 in various ways. Similarly, to the aforementioned description, the foil 500 may be interposed between the first bonding tool 234_1 and the third chip C3. In other words, the first bonding tool 234_1 and the third chip C3 may come into contact with each other through the foil 500. However, according to some embodiments, the foil 500 of FIG. 3 may include a vacuum hole for picking the third chip C3 up.

The chip bonder assembly 200 may be moved to the third position L3 along the first direction X in accordance with the control from the control unit 300. For example, the control unit 300 directly moves the chip bonder assembly 200 along the first direction X, and may control the chip bonder assembly 200 to be positioned at the third position L3. In another example, the control unit 300 moves the stage 100 along the first direction X, and may control the chip bonder assembly 200 to be positioned at the third position L3. However, the embodiments herein are not limited thereto, and those skilled in the art of the present inventive concept will understand that control unit 300 may control the chip bonder assembly 200 to be positioned at the third position L3 in various ways. The chip bonder assembly 200 may be moved along the second direction Y from the third position L3 in accordance with a control signal from the control unit 300, thereby bonding the third chip C3 onto the substrate SUB. Although the chip bonding process according to some embodiments has been described above with reference to FIGS. 2 and 3, this is a description for helping understanding, and the embodiments herein are not limited thereto. The chip bonder assembly 200 will now be described with reference to FIG. 4.

Figure 4:
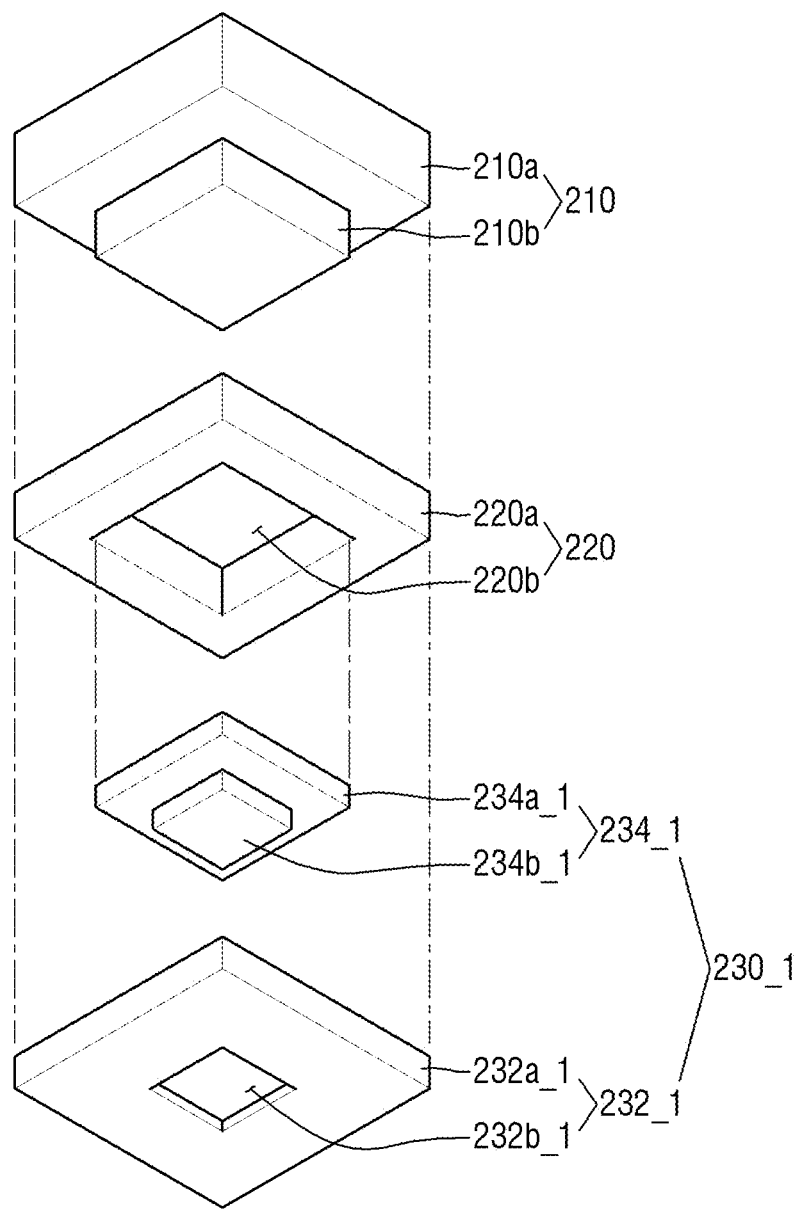
FIG. 4 is an exemplary diagram illustrating a chip bonder assembly according to some embodiments.

FIG. 4 is an exemplary diagram illustrating the chip bonder assembly according to some embodiments.

Referring to FIG. 4, the chip bonder assembly 200 may include a heater 210, a bonding tool assembly fixing unit 220, and a first bonding tool assembly 230_1. The first bonding tool assembly 230_1 may include a first bonding tool fixing unit 232_1, and a first bonding tool 234_1. Even though FIG. 4 illustrates that the heater 210, the bonding tool assembly fixing unit 220, and the first bonding tool assembly 230_1 have a rectangular shape, the embodiments herein are not limited thereto. For example, the heater 210, the bonding tool assembly fixing unit 220, and the first bonding tool assembly 230_1 may be implemented as various shapes such as a circle, an ellipse or a polygon.

The heater 210 may include a heat generating portion 210b and a body portion 210a. The heat generating portion 210b may be a portion that generates heat. For example, the heat generating portion 210b may be in contact with at least a part of the first bonding tool 234_1 to provide heat to the first bonding tool 234_1. The body portion 210a may be a part that surrounds the heat generating portion 210b. The body portion 210a may be a portion to which the bonding tool assembly fixing unit 220 is coupled. It will be understood that when an element is referred to as being "coupled" to another element, it can be directly connected or coupled to or on the other element or intervening elements may be present. In contrast, when an element is referred to as being "directly coupled" to another element, there are no intervening elements present at the point of contact.

The bonding tool assembly fixing unit 220 may include a first portion 220a and a second portion 220b. The first portion 220a may be a portion connected to the body portion 210a of the heater 210. Also, the first portion 220a may be a portion connected to the third portion 232a_1 of the first bonding tool fixing unit 232_1. The second portion 220b may be a portion into which at least a part of the heat generating portion 210b of the heater 210 is inserted. For example, at least a part of the heat generating portion 210b may be keyed to fit into (configured to fit into) the second portion 220b and the second portion 220b may be configured to receive at least a part of the heat generating portion 210b. The first portion 220a may surround the periphery of the second portion 220b. For example, the second portion 220b may be an open space or aperture, and the first portion 220a may have a shape that surrounds and defines the open space of the second portion 220b. Even though the drawings illustrate that the first portion 220a of the bonding tool assembly fixing unit 220 is implemented as a single mechanism or block, the embodiments herein are not limited thereto. For example, the bonding tool assembly fixing unit 220 may have two or more mechanisms or blocks coupled thereto.

The first bonding tool fixing unit 232_1 may include a third portion 232a_1 and a fourth portion 232b_1. The third portion 232a_1 may be connected to the first portion 220a of the bonding tool assembly fixing unit 220. It will be understood that when an element is referred to as being "connected", it can be directly connected to or on the other element or intervening elements may be present. In contrast, when an element is referred to as being "directly connected" to another element, there are no intervening elements present at the point of contact. The fourth portion 232b_1 may be a portion into which a sixth portion 234b_1 of the first bonding tool 234_1 is inserted. The third portion 232a_1 may surround the periphery of the fourth portion 232b_1. For example, the fourth portion 232b_1 may be an open space or aperture, and the third portion 232a_1 may have a shape that surrounds and defines the open space of the fourth portion 232b_1. Although some drawings herein illustrate that the third portion 232a_1 of the first bonding tool fixing unit 232_1 is implemented as a single mechanism or block, the embodiments herein are not limited thereto. For example, the first bonding tool fixing unit 232_1 may have two or more mechanisms or blocks coupled thereto.

The first bonding tool 234_1 may include a fifth portion 234a_1 and a sixth portion 234b_1. The fifth portion 234a_1 may be a portion that is in contact with the heat generating portion 210b of the heater 210. The sixth portion 234b_1 may be a portion inserted into the fourth portion 232b_1 of the first bonding tool fixing unit 232_1. For example, the sixth portion 234b_1 may be keyed to fit into (configured to fit into) the fourth portion 232b_1 and the fourth portion 232b_1 may be configured to receive the sixth portion 234b_1.

According to some embodiments, the size (or width) of the fourth portion 232b_1 of the first bonding tool fixing unit 232_1 may be smaller than the size (or width) of the first bonding tool 234_1. Thus, when the third portion 232a_1 of the first bonding tool fixing unit 232_1 is connected to the first portion 220a of the bonding tool assembly fixing unit 220, the first bonding tool 234_1 may be fitted between the first bonding tool fixing unit 232_1 and the bonding tool assembly fixing unit 220. For example, the coupling between the first bonding tool fixing unit 232_1 and the bonding tool assembly fixing unit 220 allows the first bonding tool 234_1 to come into contact with the heater 210. For example, the coupling between the first bonding tool fixing unit 232_1 and the bonding tool assembly fixing unit 220 allows the fifth portion 234a_1 of the first bonding tool 234_1 to come into contact with the heating portion 210b of the heater 210. At this time, the fifth portion 234a_1 of the first bonding tool 234_1 may be in direct contact with the heat generating portion 210b of the heater 210, and there may also be some space between the fifth portion 234a_1 and the heat generating portion 210b. This will be described with further reference to FIG. 5.

Figure 5:
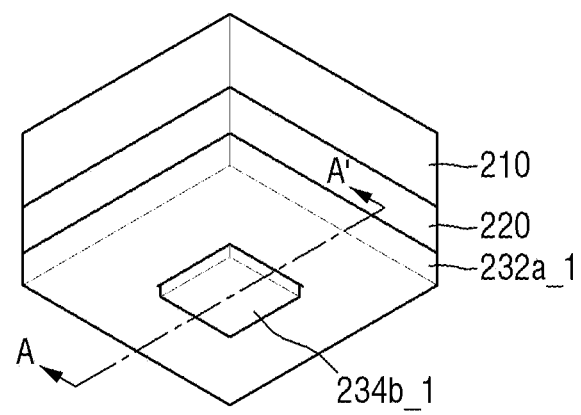
FIG. 5 is an exemplary diagram illustrating coupling of the chip bonder assembly according to some embodiments.

FIG. 5 is an exemplary diagram illustrating coupling of the chip bonder assembly according to some embodiments.

Referring to FIGS. 4 and 5, the heater 210 and the bonding tool assembly fixing unit 220 may be coupled together, i.e., in a coupled state in which the aforementioned elements are coupled together. For example, the body portion 210a of the heater 210 may be coupled with the first portion 220a of the bonding tool assembly fixing unit 220. The heat generating portion 210b of the heater 210 may be inserted into the second portion 220b of the bonding tool assembly fixing unit 220.

The bonding tool assembly fixing unit 220 may be coupled with the first bonding tool assembly 230_1. For example, the first portion 220a of the bonding tool assembly fixing unit 220 may be coupled with the third portion 232a_1 of the first bonding tool fixing unit 232_1. As described above, since the size of the first bonding tool 234_1 is larger than the size of the fourth portion 232b_1 of the first bonding tool fixing unit 232_1, when the first portion 220a of the bonding tool assembly fixing unit 220 and the third portion 232a_1 of the first bonding tool fixing unit 232_1 are coupled together, the first bonding tool 234_1 may be fitted between the bonding tool assembly fixing unit 220 and the first bonding tool fixing unit 232_1. At this time, the first bonding tool 234_1 may be in contact with the heat generating portion 210b of the heater 210.

According to some embodiments, the sixth portion 234b_1 of the first bonding tool 234_1 may protrude from the third portion 232a_1 of the first bonding tool fixing unit 232_1. The sixth portion 234b_1 of the first bonding tool 234_1 may be a portion to be in contact with the chips (e.g., the first chip C1 to the third chip C3) by way of the foil 500. For example, sixth portion 234b_1 of the first bonding tool 234_1 may protrude past a lower underside of the third portion 232a_1 of the first bonding tool fixing unit 232_1 while also being interposed, at least partly, by the third portion 232a_1 of the first bonding tool fixing unit 232_1. For an additional description, reference is made to FIG. 6.

Figure 6:
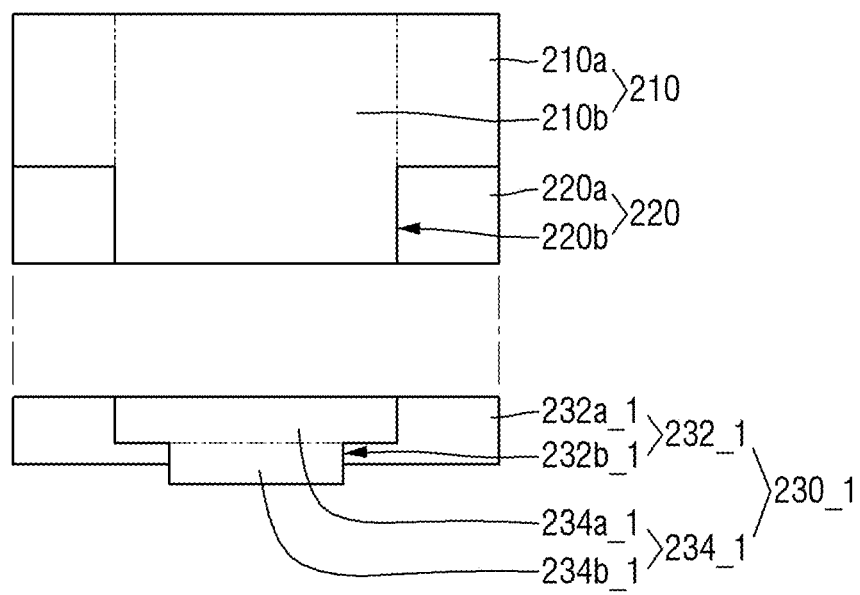
FIG. 6 is an exemplary diagram illustrating the chip bonder assembly according to some embodiments.

FIG. 6 is an exemplary diagram illustrating the chip bonder assembly according to some embodiments. FIG. 6 illustrates a cross-sectional view taken along the line A-A' of FIG. 5. For convenience of explanation, repeated or similar contents will be omitted or briefly described.

Referring to FIG. 6, the first bonding tool assembly 230_1 may be attached to and detached from the bonding tool assembly fixing unit 220. For example, the first bonding tool fixing unit 232_1 may be attached to and detached from the bonding tool assembly fixing unit 220. As described above, since the first bonding tool 234_1 is interposed between the first bonding tool fixing unit 232_1 and the bonding tool assembly fixing unit 220, the first bonding tool 234_1 may also be attached and detached due to attachment and detachment of the first bonding tool fixing unit 232_1.

The first bonding tool 234_1 may come into contact with the chips (e.g., the first chip C1 to third chip C3). Therefore, the first bonding tool 234_1 may be designed to minimize deformation and breakage.

Conversely, in conventional bonding apparatuses when a bonding tool is directly fixed to a heater, it may be physically stressed due to the direct connection with the heater, e.g., physical stresses, thermal stresses, and other mechanical stresses. In some situations, if a physical stress is sustained on the bonding tool, the bonding tool may become deformed or broken. If the bonding tool is deformed or broken, the chip to be bonded may be broken and/or the chip bonding process may not be properly performed, which may reduce the yield of a semiconductor fabricating process. Also, if the bonding tool is directly fixed to the heater an accident such as falling-off of the bonding tool may occur when the connection of the bonding tool is relatively weak.

Thus, the chip bonding apparatus according to some embodiments of the present inventive concept allows the first bonding tool 234_1 to be retained in place by interposing it between the bonding tool assembly fixing unit 220 and the first bonding tool fixing unit 232_1. Therefore, the physical stress applied to the first bonding tool 234_1 is minimized, and deformation or breakage of the first bonding tool 234_1 may also be minimized when compared against conventional assemblies in which a conventional bonding tool is directly attached (fixedly attached) to a heater, as explained above. Also, instead of attaching the first bonding tool 234_1 itself directly to the heater 210, the first bonding tool fixing unit 232_1 is removably coupled to the bonding tool assembly fixing unit 220. Therefore, this exemplary configuration allows the connection of the first bonding tool fixing unit 232_1 to be maintained relatively strong and retained in its designed position. Likewise, since the first bonding tool 234_1 is interposed between the bonding tool assembly fixing unit 220 and the first bonding tool fixing unit 232_1, the connection of the first bonding tool 234_1 is maintained relatively strong, and the first bonding tool 234_1 is prevented from falling off when the chip bonding process is performed.

Figure 7:
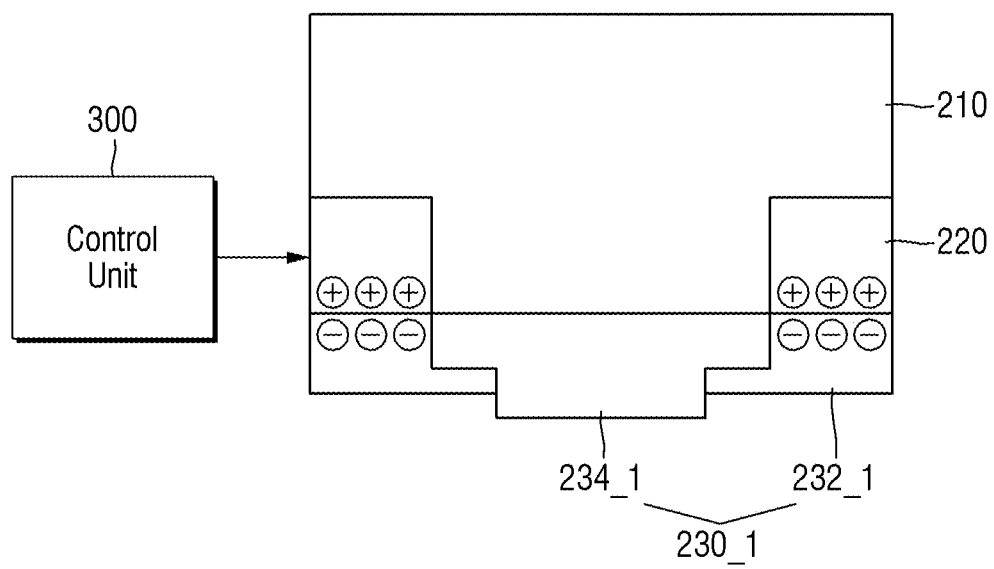
FIG. 7 is an exemplary diagram illustrating a method for attaching a first bonding tool assembly to a bonding tool assembly fixing unit according to some embodiments.

FIG. 7 is an exemplary diagram illustrating a method for attaching the first bonding tool assembly to the bonding tool assembly fixing unit according to some embodiments. FIG. 7 illustrates a cross-sectional view taken along line A-A' of FIG. 5. For convenience of explanation, repeated or similar contents will be omitted or briefly described.

Referring to FIG. 7, a bonding tool assembly fixing unit 220 according to some embodiments may be implemented as an electrostatic chuck. According to some embodiments, the bonding tool assembly fixing unit 220 may receive application of an applied voltage from the control unit 300. For example, if the bonding tool assembly fixing unit 220 is charged to a positive charge, the first bonding tool fixing unit 232_1 may be charged to a negative charge. At this time, an electrical attractive force may be generated between the bonding tool assembly fixing unit 220 and the first bonding tool fixing unit 232_1. The first bonding tool assembly fixing unit 232_1 may be attached to the bonding tool assembly fixing unit 220 due to the electrical attractive force between the bonding tool assembly fixing unit 220 and the first bonding tool fixing unit 232_1. As described above, if the first bonding tool fixing unit 232_1 is attached to the bonding tool assembly fixing unit 220, the first bonding tool 234_1 may come into contact with the heater 210.

Figure 8:
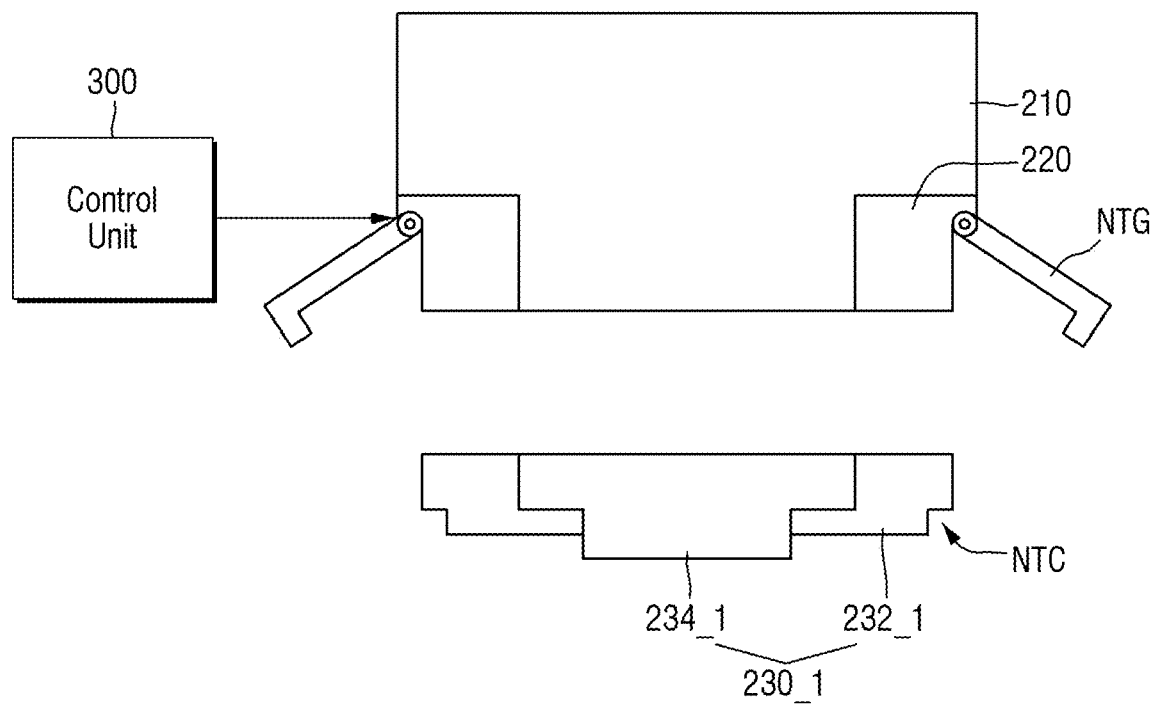
FIGS. 8 and 9 are exemplary diagrams illustrating a method of attaching the first bonding tool assembly to the bonding tool assembly fixing unit according to some other embodiments.
Figure 9:
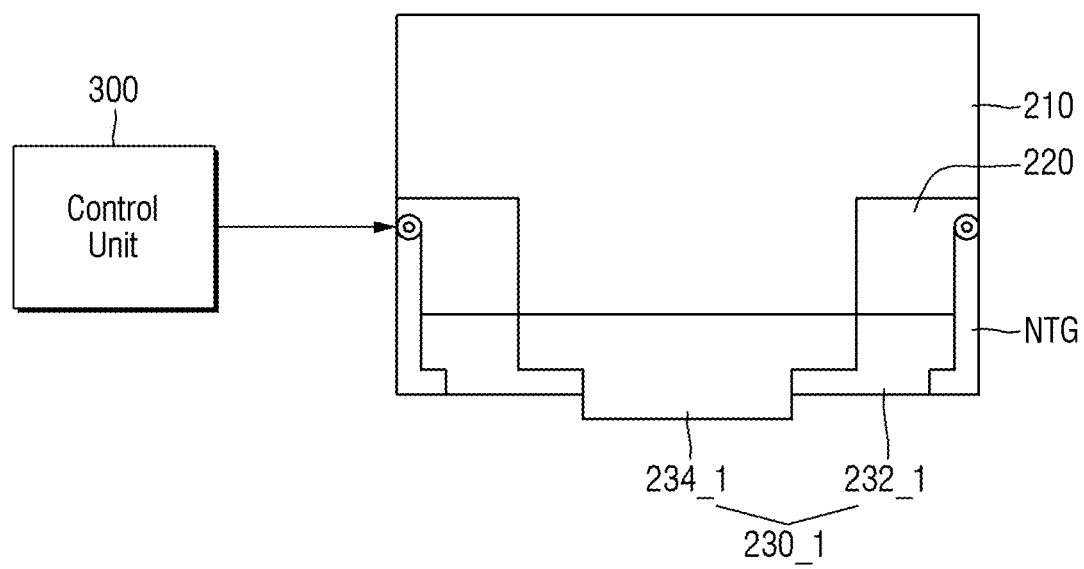

FIGS. 8 and 9 are exemplary diagrams illustrating a method of attaching the first bonding tool assembly to the bonding tool assembly fixing unit according to some other embodiments. FIGS. 8 and 9 illustrate cross-sectional views taken along line A-A' of FIG. 5, respectively. For convenience of explanation, repeated or similar contents will be omitted or briefly described.

Referring to FIGS. 8 and 9, the bonding tool assembly fixing unit 220 according to some embodiments may further include a notch gripper NTG. For example, notch gripper NTG may be a rotatable lever arm that can rotate outwards (open) and rotate inwards (close). Also, the first bonding tool fixing unit 232_1 may further include a notch NTC corresponding in size and geometry of the notch gripper NTG.

According to some embodiments, the control unit 300 may control the notch gripper NTG included in the bonding tool assembly fixing unit 220. For example, when the notch gripper NTG is opened in accordance with a control signal of the control unit 300, the first bonding tool assembly 230_1 may be detached from the bonding tool assembly fixing unit 220. When the notch gripper NTG is closed in accordance with the control of the control unit 300, the notch gripper NTG may be coupled to (retained by) the notch NTC of the first bonding tool fixing unit 232_1. If the notch gripper NTG and the notch NTC are coupled together, the first bonding tool assembly 230_1 may be connected to the bonding tool assembly fixing unit 220. The opening/closing of the notch gripper NTG may be controlled using, for example, an electric motor, an air pressure system or the like, but the embodiments herein are not limited thereto. As described above, when the first bonding tool fixing unit 232_1 is attached and fixed to the bonding tool assembly fixing unit 220, the first bonding tool 234_1 may come into contact with the heater 210.

Figure 10:
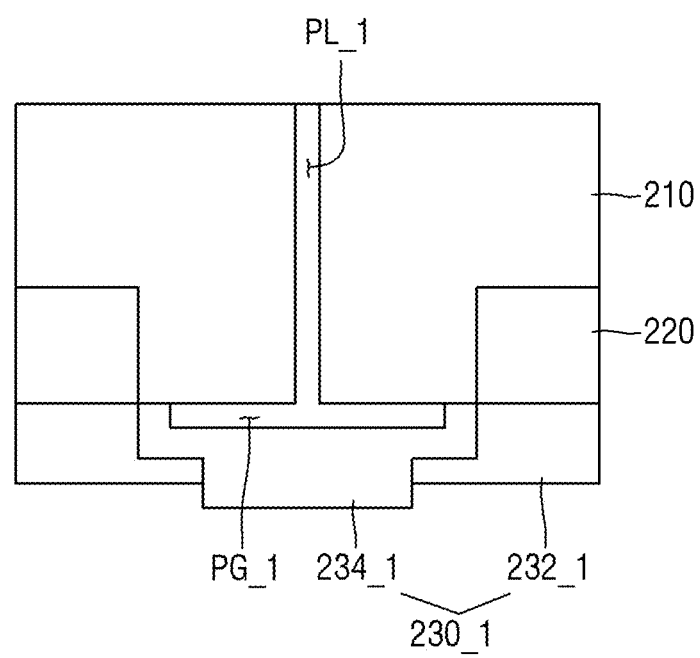
FIGS. 10 and 11 are exemplary diagrams illustrating the heater and the first bonding tool according to some embodiments.
Figure 11:
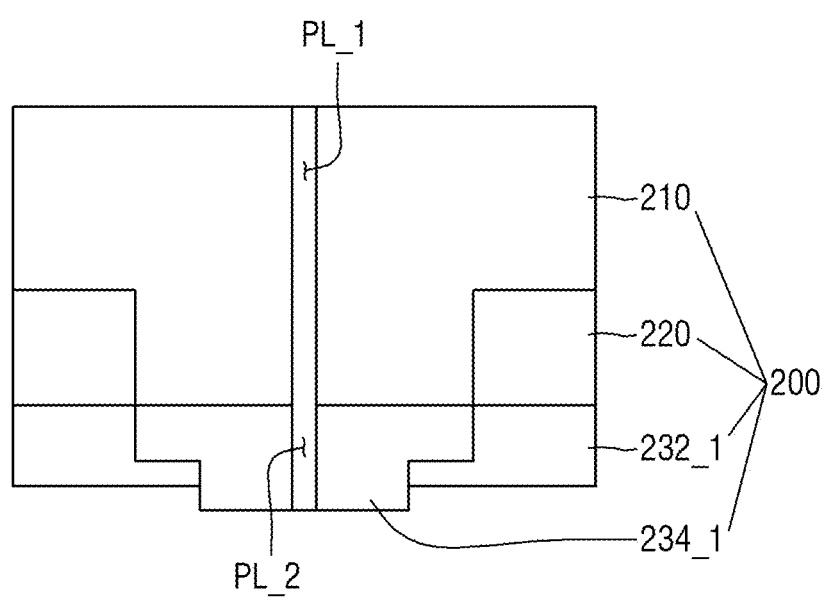

FIGS. 10 and 11 are exemplary diagrams illustrating a heater and a first bonding tool according to some embodiments. FIGS. 10 and 11 illustrate cross-sectional views taken along the line A-A' of FIG. 5, respectively. For convenience of explanation, repeated or similar contents will be omitted or briefly described.

Referring to FIG. 10, the heater 210 according to some embodiments may further include a first pumping line PL_1 passing through the interior of the heater 210. In addition, the first bonding tool 234_1 may further include a first pumping groove PG_1 formed on an upper surface of the first bonding tool 234_1. The first pumping line PL_1 and the first pumping groove PG_1 may be connected to each other. For example, first pumping line PL_1 and the first pumping groove PG_1 form a path for fluid and are in fluid communication with one another, i.e., they are connected. The air inside the first pumping line PL_1 and the first pumping groove PG_1 may be exhausted by an external pump. For example, due to the external pump, the first pumping line PL_1 and the first pumping groove PG_1 may be in a vacuum state. When the first pumping line PL_1 and the first pumping groove PG_1 are in the vacuum state, the connection between the first bonding tool 234_1 and the heater 210 are complemented by the atmospheric pressure difference.

Referring to FIG. 11, the first bonding tool 234_1, according to some embodiments, may further include a second pumping line PL_2. The second pumping line PL_2 may be connected to the first pumping line PL_1. The first pumping line PL_1 and the second pumping line PL_2 may be connected to an external pump. According to some embodiments, when the external pump is connected to the first pumping line PL_1 and the second pumping line PL_2 operates, the chip bonder assembly 200 may pick a chip (e.g., a first chip C) up. For example, when the chip bonder assembly 200 is in contact with a chip, the external pump exhausts the air in the first pumping line PL_1 and the second pumping line PL_2 to generate an atmospheric pressure difference, and the chip can be picked up by the chip bonder assembly 200 due to the atmospheric pressure difference.

In the exemplary embodiment of FIG. 11, second pumping line PL_2 is utilized instead of the first pumping groove PG_1 (see FIG. 10). However, those skilled in the art will understand that other embodiments in accordance with the inventive concept disclosed herein may have both first pumping groove PG_1 and second pumping line PL_2. Additionally, embodiments that use both may also have all of the advantages as disclosed above. For example, the atmospheric pressure difference may strengthen the connection between the first bonding tool 234_1 and the heater 210 (embodiment of FIG. 10) as well as enabling a chip to be picked up by the atmospheric pressure difference (embodiment of FIG. 11).

Figure 12:
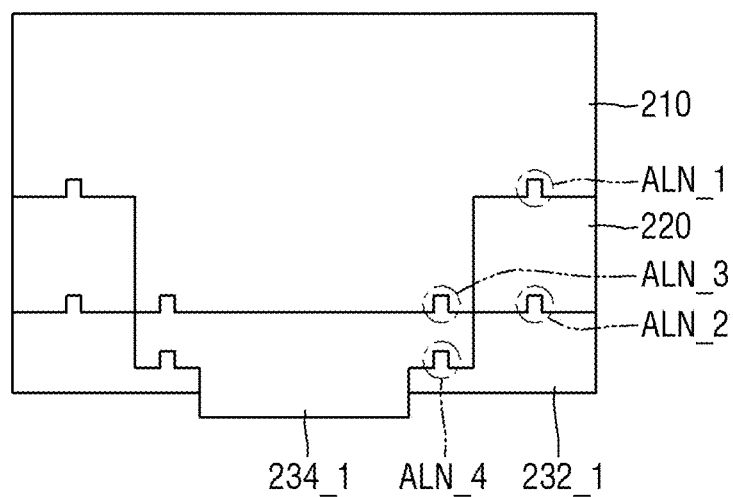
FIGS. 12 and 13 are exemplary diagrams illustrating the chip bonder assembly according to some embodiments.
Figure 13:
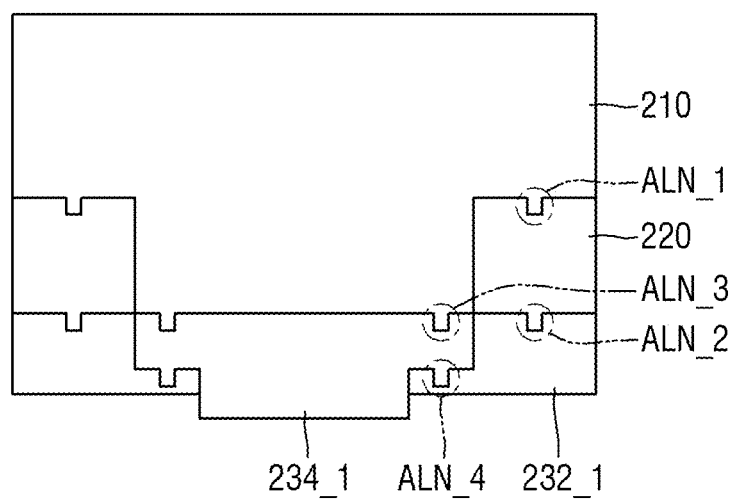

FIGS. 12 and 13 are exemplary diagrams illustrating a chip bonder assembly according to some embodiments. FIGS. 12 and 13 illustrate different exemplary cross-sectional views taken along line A-A' of FIG. 5, respectively.

For convenience of explanation, repeated or similar contents will be omitted or briefly described.

Referring to FIGS. 12 and 13, the chip bonder assembly 200 may further include a first alignment portion ALN_1 between the heater 210 and the bonding tool assembly fixing unit 220. For example, as illustrated in FIG. 12, the heater 210 may include a depressed first alignment groove, and the bonding tool assembly fixing unit 220 may include an embossed (raised) first alignment pin that corresponds to the depressed alignment groove. As another example, and as illustrated in FIG. 13, the heater 210 may include an embossed first alignment pin, and the bonding tool assembly fixing unit 220 may include a depressed first alignment groove that corresponds to the embossed first alignment pin.

The chip bonder assembly 200 may further include a second alignment portion ALN_2 between the bonding tool assembly fixing unit 220 and the first bonding tool fixing unit 232_1. For example, as illustrated in FIG. 12, the bonding tool assembly fixing unit 220 may include a depressed second alignment groove, and the first bonding tool fixing unit 232_1 may include an embossed second alignment pin that corresponds to the second alignment groove. As another example, and as illustrated in FIG. 13, the bonding tool assembly fixing unit 220 may include an embossed second alignment pin, and the first bonding tool fixing unit 232_1 may include a depressed second alignment groove that corresponds to the embossed second alignment pin.

The chip bonder assembly 200 may further include a third alignment portion ALN_3 between the heater 210 and the first bonding tool 234_1. For example, as illustrated in FIG. 12, the heater 210 may include a depressed third alignment groove, and the first bonding tool 234_1 may include an embossed third alignment pin that corresponds to the third alignment groove. As another example, as illustrated in FIG. 13, the heater 210 may include an embossed third alignment pin, and the first bonding tool 234_1 may include a depressed fourth alignment groove that corresponds to the third alignment pin.

The chip bonder assembly 200 may further include a fourth alignment portion ALN_4 between the first bonding tool 234_1 and the first bonding tool fixing unit 232_1. For example, as illustrated in FIG. 12, the first bonding tool 234_1 may include a depressed fourth alignment groove, and the first bonding tool fixing unit 232_1 may include an embossed fourth alignment pin that corresponds to the fourth alignment groove. As another example, and as illustrated in FIG. 13, the first bonding tool 234_1 may include an embossed fourth alignment pin, and the first bonding tool fixing unit 232_1 may be a depressed fourth alignment groove that corresponds to the fourth alignment pin.

Other embodiments of the present inventive concept that utilize alignment portions are not limited to those alignment portions illustrated in FIGS. 12 and 13. For example, only some of the alignment portions (first alignment portion ALN_1 to the fourth alignment portion ALN_4) are implemented. Likewise, any combination of alignment portions (first alignment portion ALN_1 to the fourth alignment portion ALN_4) of FIGS. 12 and 13 may be used. For example, a first alignment portion ALN_1 of FIG. 12 and a fourth alignment portion ALN_4 of FIG. 13.

Referring again to FIG. 1, the bonding tool assembly storage unit 400 may store the second bonding tool assembly 230_2. The second bonding tool assembly 230_2 may include a second bonding tool fixing unit 232_2 and a second bonding tool 234_2. Since the second bonding tool fixing unit 232_2 and the second bonding tool 234_2 can be similar to the first bonding tool fixing unit 232_1 and the first bonding tool 234_1, a detailed description thereof will not be provided.

However, the second bonding tool 234_2 may be different from the first bonding tool 234_1 as may depend upon its intended application. For example, the system of FIG. 2 may utilize the first bonding tool 234_1, and the system of FIG. 3 may utilize the second bonding tool 234_2. Thus, the chip bonding apparatus according to some embodiments may be used by installing an appropriate bonding tool assembly in view of the type of chip bonding process to be performed, i.e., on an as needed basis. Further reference is made to FIGS. 14 and 15 to describe a system for replacing the bonding tool assembly according to some embodiments.

Figure 14:
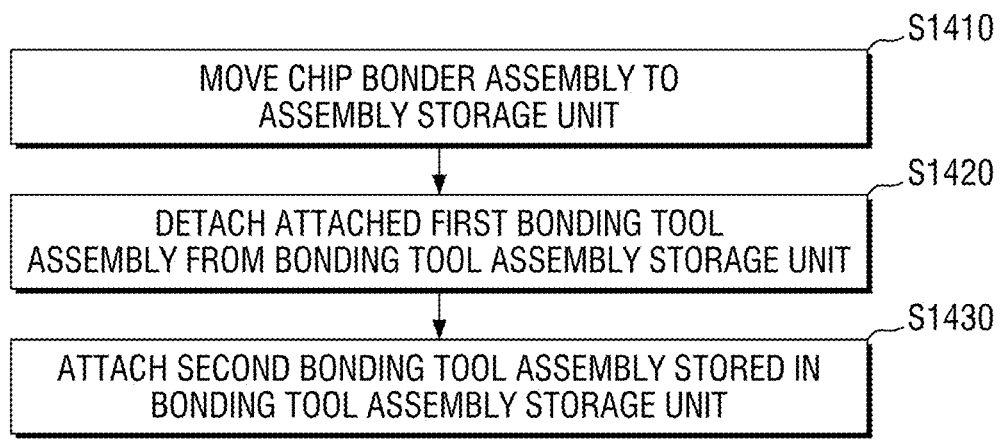
FIG. 14 is an exemplary flow chart illustrating a system for replacing the bonding tool assembly according to some embodiments.
Figure 15:
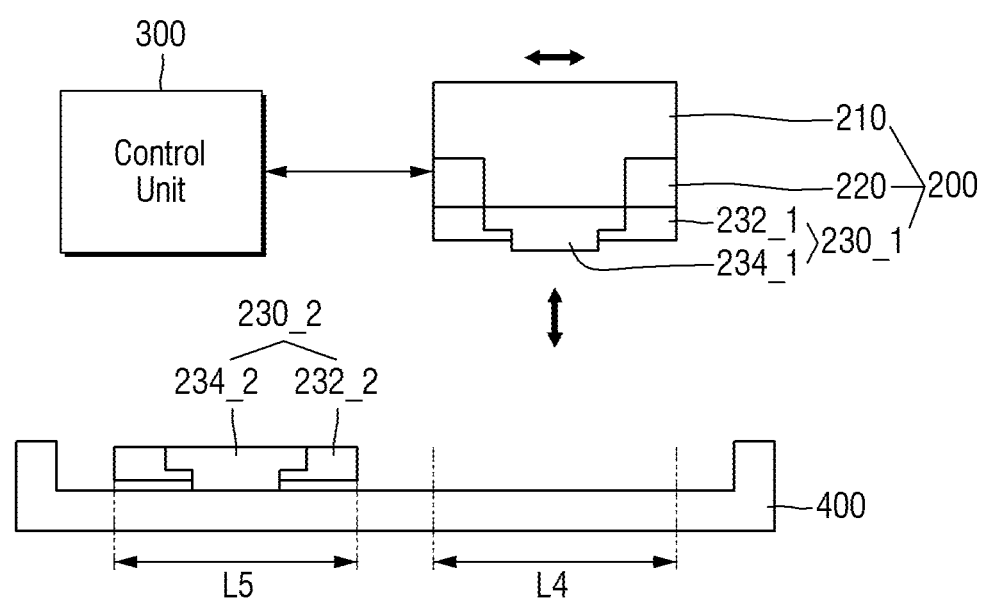
FIG. 15 is an exemplary diagram illustrating the system for replacing the bonding tool assembly according to some embodiments.

FIG. 14 is an exemplary flow chart for explaining a system for replacing (or exchanging) the bonding tool assembly according to some embodiments. FIG. 15 is an exemplary diagram illustrating a system for replacing a bonding tool assembly according to some embodiments. For convenience of explanation, repeated or similar contents will be omitted or briefly described. Also, for convenience of description, the present chip bonding apparatus will be described on the basis that the first bonding tool assembly 230_1 is already installed.

Referring to FIGS. 14 and 15, the bonding tool assembly storage unit 400 may store the second bonding tool assembly 230_2. For example, the second bonding tool fixing unit 232_2 and the second bonding tool 234_2 may be held in the bonding tool assembly storage unit 400 separately in a non-coupled state or in a state of being coupled to each other. For example, bonding tool assembly storage unit 400 may couple to any of the bonding tool fixing units 232_1, 232_2, 232_3 for storage, maintenance, and general operation purposes. Additionally, bonding tool assembly storage unit 400 may have alignment portions that correspond to those discussed with respect to FIGS. 12 and 13.

In accordance with a control signal of the control unit 300, the chip bonder assembly 200 may be moved to the bonding tool assembly storage unit 400 (S1410). For example, the chip bonder assembly 200 may be moved to a fourth position L4 of the bonding tool assembly storage unit 400 in accordance with a control signal of the control unit 300.

Subsequently, the chip bonder assembly 200 may detach the first bonding tool assembly 230_1 in accordance with a control signal of the control unit 300 (S1420). For example, the chip bonder assembly 200 may detach the first bonding tool assembly 230_1 at the fourth position L4 in accordance with a control signal of the control unit 300.

Subsequently, the chip bonder assembly 200 may attach the second bonding tool assembly 230_2 in accordance with a control signal of the control unit 300 (S1430). For example, the chip bonder assembly 200 (from which the first bonding tool assembly 230_1 is detached) moves to a fifth position L5 in accordance with a control signal of the control unit 300, and may attach the second bonding tool assembly 230_2.

Although FIGS. 1 and 15 illustrate that the bonding tool assembly storage unit 400 stores only the second bonding tool assembly 230_2, the embodiments disclosed herein are not limited thereto. The bonding tool assembly storage unit 400 may store two or more bonding tool assemblies.

According to some embodiments, the system for replacing the bonding tool assembly may be controlled by a control signal from the control unit 300. In other words, the system for replacing the bonding tool assembly may be implemented in an automation system that does not require a manual operation of the user. However, in some embodiments a human user may manually replace the bonding tool assembly and/or manually operate the control unit 300 to perform the replacement of any of bonding tool assemblies 230_1, 230_2, 230_3.

Figure 16:
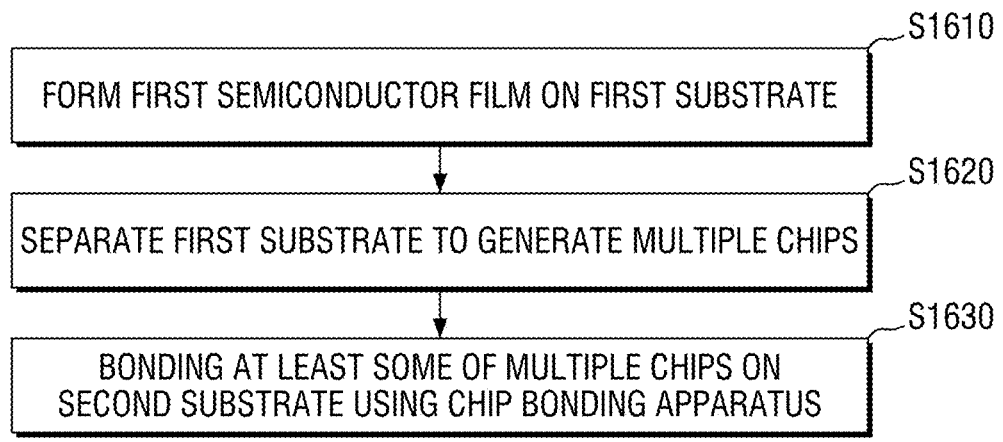
FIG. 16 is an exemplary flow chart illustrating the method for fabricating the semiconductor device according to some embodiments.

FIG. 16 is an exemplary flow chart illustrating a method for fabricating a semiconductor device according to some embodiments. For convenience of explanation, repeated or similar contents will be omitted or briefly described.

Referring to FIG. 16, a first semiconductor film may be formed on a first substrate (S1610). The first semiconductor film may include various materials as would be understood by a person skilled in the art of the present inventive concept.

The first substrate may be separated to generate (form) a plurality of chips (for example, a first chip C1 and a second chip C2) (S1612).

At least some of the plurality of chips generated may be bonded onto a second substrate (e.g., a substrate SUB), using a chip bonding apparatus according to exemplary embodiments disclosed herein (S1630).

In concluding the detailed description, those skilled in the art will appreciate that many variations and modifications may be made to the disclosed embodiments without substantially departing from the principles of the present inventive concept. Therefore, the disclosed embodiments of the inventive concept are used in a descriptive sense only and shall not be construed for purposes of limitation.

What is claimed is:

1. A chip bonding apparatus comprising:
   a stage configured to support a substrate;
   a heater disposed above the stage, the heater including a heat generating portion and a body portion;
   a bonding tool assembly fixing unit including a first portion connected to the body portion of the heater, and a second portion configured to receive the heat generating portion of the heater;
   a first bonding tool connected to the heat generating portion of the heater; and
   a first bonding tool fixing unit including a third portion connected to the first portion of the bonding tool assembly fixing unit, and a fourth portion configured to receive the first bonding tool,
   wherein the first bonding tool includes a fifth portion and a sixth portion, the fifth portion disposed between the bonding tool assembly fixing unit and the first bonding tool fixing unit, and the sixth portion partly disposed between the bonding tool assembly fixing unit and the first bonding tool fixing unit, and
   wherein the third portion of the first bonding tool fixing unit is configured to attach to the first portion of the bonding tool assembly fixing unit by an electrostatic force.

2. The chip bonding apparatus of claim 1, wherein the third portion of the first bonding tool fixing unit is attached to the first portion of the bonding tool assembly fixing unit, and the first bonding tool and the heat generating portion are connected to each other.

3. The chip bonding apparatus of claim 1, wherein the sixth portion of the first bonding tool is surrounded by, at least partly, the fourth portion of the bonding tool assembly fixing unit, and
   wherein the sixth portion of the first bonding tool protrudes from the first bonding tool fixing unit.

4. The chip bonding apparatus of claim 1, wherein the first portion of the bonding tool assembly fixing unit is disposed to surround the second portion of the bonding tool assembly fixing unit, and the third portion of the first bonding tool fixing unit is disposed to surround the fourth portion of the first bonding tool fixing unit.

5. The chip bonding apparatus of claim 1, wherein the heater further comprises a first pumping line connected to an external pump and passing through the interior of the heater.

6. The chip bonding apparatus of claim 5, wherein the first bonding tool further comprises a first pumping groove connected to the first pumping line,
   wherein the first pumping groove is formed on an upper surface of the first bonding tool.

7. The chip bonding apparatus of claim 5, wherein the first bonding tool further comprises a second pumping line that is connected to the first pumping line, and
   wherein the second pumping line passes through the interior of the first bonding tool.

8. The chip bonding apparatus of claim 1, further comprising:
   a bonding tool assembly storage unit;
   a second bonding tool fixing unit; and
   a second bonding tool connected to the second bonding tool fixing unit,
   wherein the bonding tool assembly storage unit is configured to store the second bonding tool fixing unit and the second bonding tool.

9. The chip bonding apparatus of claim 1, further comprising:
   a first alignment portion disposed between the heater and the bonding tool assembly fixing unit,
   wherein the first alignment portion is configured to align the heater and the bonding tool assembly fixing unit.

10. The chip bonding apparatus of claim 1, further comprising:
    a second alignment portion disposed between the bonding tool assembly fixing unit and the first bonding tool fixing unit,
    wherein the second alignment portion is configured to align the bonding tool assembly fixing unit and the first bonding tool fixing unit.

11. The chip bonding apparatus of claim 1, further comprising:
    a third alignment portion disposed between the first bonding tool fixing unit and the first bonding tool,
    wherein the third alignment portion is configured to align the first bonding tool fixing unit and the first bonding tool.

12. The chip bonding apparatus of claim 1, further comprising:
    a fourth alignment portion disposed between the heater and the first bonding tool,
    wherein the fourth alignment portion is configured to align the heater and the first bonding tool.

* * * * *